(12) United States Patent
Kim et al.

(10) Patent No.: US 10,447,312 B2
(45) Date of Patent: Oct. 15, 2019

(54) METHOD OF PERFORMING INTERLEAVING USING LDPC AND COMMUNICATION APPARATUS THEREFOR

(71) Applicant: LG ELECTRONICS INC., Seoul (KR)

(72) Inventors: Jinwoo Kim, Seoul (KR); Jongwoong Shin, Seoul (KR); Bonghoe Kim, Seoul (KR); Byounghoon Kim, Seoul (KR); Kwangseok Noh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/821,393

(22) Filed: Nov. 22, 2017

(65) Prior Publication Data

US 2018/0152205 A1 May 31, 2018

Related U.S. Application Data

(60) Provisional application No. 62/426,322, filed on Nov. 25, 2016.

(51) Int. Cl.
| | | |
|---|---|---|
| *H03M 13/27* | (2006.01) | |
| *H04L 1/00* | (2006.01) | |
| *H03M 13/11* | (2006.01) | |
| *H03M 13/25* | (2006.01) | |
| *H03M 13/29* | (2006.01) | |
| *H03M 13/00* | (2006.01) | |
| *H04L 27/34* | (2006.01) | |
| *H03M 13/09* | (2006.01) | |

(52) U.S. Cl.
CPC ...... *H03M 13/2792* (2013.01); *H03M 13/255* (2013.01); *H03M 13/2707* (2013.01); *H03M 13/2906* (2013.01); *H03M 13/6306* (2013.01); *H04L 1/0057* (2013.01); *H04L 1/0058* (2013.01); *H04L 1/0071* (2013.01); *H03M 13/09* (2013.01); *H03M 13/1102* (2013.01); *H03M 13/116* (2013.01); *H03M 13/1185* (2013.01); *H04L 27/3405* (2013.01)

(58) Field of Classification Search
CPC .......... H03M 13/2792; H03M 13/1102; H04L 1/0058; H04L 1/0071; H04L 27/3405
See application file for complete search history.

(56) References Cited

U.S. PATENT DOCUMENTS

| | | | |
|---|---|---|---|
| 2011/0060970 A1* | 3/2011 | Kim | H03M 13/271 714/786 |
| 2017/0012739 A1* | 1/2017 | Shen | H03M 13/13 |
| 2017/0171850 A1* | 6/2017 | Ang | H04L 5/0055 |
| 2017/0230149 A1* | 8/2017 | Wang | H04L 1/1819 |
| 2018/0019900 A1* | 1/2018 | Sun | H04L 1/0057 |

* cited by examiner

*Primary Examiner* — Kyle Vallecillo
(74) *Attorney, Agent, or Firm* — Birch, Stewart, Kolasch & Birch, LLP (57) ABSTRACT

A method of performing interleaving, which is performed by a communication apparatus using a low-density parity-check code (LDPC), includes outputting LDPC encoded bits to a block interleaver, and performing block interleaving on the LDPC encoded bits inputted to the block interleaver in a unit of a size of one time transport block based on the a position of redundancy version.

15 Claims, 6 Drawing Sheets

(a) column read in random order (b) column read in circular way

METHOD OF PERFORMING INTERLEAVING USING LDPC AND COMMUNICATION APPARATUS THEREFOR

Pursuant to 35 U.S.C. § 119(e), this application claims the benefit of priority to Provisional Application No. 62/426,322, filed on Nov. 25, 2016, the contents of which are incorporated by reference herein in their entirety.

BACKGROUND OF THE INVENTION

Field of the Invention

The present invention relates to a wireless communication, and more particularly, to a method of performing interleaving using LDPC and a communication apparatus therefor.

Discussion of the Related Art

A next generation 5G system considers a wireless sensor network (WSN), a massive machine type communication (MTC), and the like intermittently transmitting a small packet to achieve such a target as massive connection/low cost/low power service.

The massive MTC service has very limitative connection density requirement. On the other hand, the massive MTC service is very flexible in a data rate and an end-to-end (E2E) latency requirement (e.g., connection density: up to 200,000/km2, E2E latency: seconds to hours, DL/UL data rate: typically 1-100 kbps).

SUMMARY OF THE INVENTION

Accordingly, the present invention is directed to an apparatus and method thereof that substantially obviate one or more problems due to limitations and disadvantages of the related art.

A technical task of the present invention is to provide a method for a communication apparatus to perform interleaving using LDPC.

Another technical task of the present invention is to provide a communication apparatus capable of performing interleaving using LDPC.

Technical tasks obtainable from the present invention are non-limited the above-mentioned technical task. And, other unmentioned technical tasks can be clearly understood from the following description by those having ordinary skill in the technical field to which the present invention pertains.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, according to one embodiment, a method of performing interleaving, which is performed by a communication apparatus using a low-density parity-check code (LDPC), may include outputting LDPC encoded bits to a block interleaver, and performing independent block interleaving on the LDPC encoded bits inputted to the block interleaver in a unit of a size of one time transport block based on a size of redundancy version.

The method may further include outputting the bits on which the block interleaving is performed to a symbol modulation mapper. In this case, the performing the block interleaving may include performing block interleaving to sequentially map parity bits of information bits corresponding to output bits of the block interleaver from an MSB to an LSB of a symbol.

The performing the block interleaving may include writing the LDPC encoded bits inputted to the block interleaver in a memory of the block interleaver in a unit of a resource allocation size corresponding to a symbol unit in a row direction, and reading the LDPC encoded bits from the memory of the block interleaver in a unit of bits corresponding to a modulation order in a column direction.

The performing the block interleaving may include writing the LDPC encoded bits inputted to the block interleaver in a memory of the block interleaver in a unit of a resource allocation size corresponding to a symbol unit in a row direction, and reading the LDPC encoded bits from the memory of the block interleaver in a unit of bits corresponding to a modulation order in a column direction.

The modulation mapper may include a quadrature amplitude modulation (QAM) modulation mapper and the symbol can include a QAM symbol.

The columns can be read from the memory of the block interleaver in a random order. When every column mapped to the symbol is read from a memory of the block interleaver, an order ranging from the MSB to the LSB can be read in a manner of being circularly shifted.

The block interleaving can be performed on information bits and parity bits except an information shortening region among the LDPC encoded bits inputted to the block interleaver.

To further achieve these objects and other advantages and in accordance with the purpose of the invention, as embodied and broadly described herein, according to a different embodiment, a communication apparatus for performing interleaving using a low-density parity-check code (LDPC) can include an LDPC encoder configured to output LDPC encoded bits to a block interleaver, and the block interleaver configured to perform independent block interleaving on the LDPC encoded bits inputted to the block interleaver in a unit of a size of one time transport block based on a size of redundancy version.

The block interleaver is configured to output the bits on which the block interleaving is performed to a symbol modulation mapper and perform block interleaving to sequentially map parity bits of information bits corresponding to output bits of the block interleaver from an MSB to an LSB of a symbol.

The block interleaver is configured to write the LDPC encoded bits inputted to the block interleaver in a memory of the block interleaver in a unit of a resource allocation size corresponding to a symbol unit in a row direction and read the LDPC encoded bits from the memory of the block interleaver in a unit of bits corresponding to a modulation order in a column direction.

The modulation mapper may include a quadrature amplitude modulation (QAM) modulation mapper. The block interleaver can be configured to read columns from the memory in a random order.

The block interleaver may be configured to read columns from the memory in a random order. When every column mapped to the symbol is read from a memory of the block interleaver, the block interleaver can be configured to read an order ranging from the MSB to the LSB in a manner of circularly shifting the order.

According to one embodiment of the present invention, it is able to improve performance of channel coding using a method of performing interleaving using LDPC.

Effects obtainable from the present invention may be non-limited by the above mentioned effect. And, other unmentioned effects can be clearly understood from the following description by those having ordinary skill in the technical field to which the present invention pertains.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. In the following detailed description of the invention includes details to help the full understanding of the present invention. Yet, it is apparent to those skilled in the art that the present invention can be implemented without these details. For instance, although the following descriptions are made in detail on the assumption that a mobile communication system includes 3GPP LTE system, the following descriptions are applicable to other random mobile communication systems in a manner of excluding unique features of the 3GPP LTE.

Occasionally, to prevent the present invention from getting vaguer, structures and/or devices known to the public are skipped or can be represented as block diagrams centering on the core functions of the structures and/or devices. Wherever possible, the same reference numbers will be used throughout the drawings to refer to the same or like parts.

Besides, in the following description, assume that a terminal is a common name of such a mobile or fixed user stage device as a user equipment (UE), a mobile station (MS), an advanced mobile station (AMS) and the like. And, assume that a base station (BS) is a common name of such a random node of a network stage communicating with a terminal as a Node B (NB), an eNode B (eNB), an access point (AP) and the like.

In a mobile communication system, a user equipment is able to receive information in downlink and is able to transmit information in uplink as well. Information transmitted or received by the user equipment node may include various kinds of data and control information. In accordance with types and usages of the information transmitted or received by the user equipment, various physical channels may exist.

The following descriptions are usable for various wireless access systems including CDMA (code division multiple access), FDMA (frequency division multiple access), TDMA (time division multiple access), OFDMA (orthogonal frequency division multiple access), SC-FDMA (single carrier frequency division multiple access) and the like. CDMA can be implemented by such a radio technology as UTRA (universal terrestrial radio access), CDMA 2000 and the like. TDMA can be implemented with such a radio technology as GSM/GPRS/EDGE (Global System for Mobile communications)/General Packet Radio Service/Enhanced Data Rates for GSM Evolution). OFDMA can be implemented with such a radio technology as IEEE 802.11 (Wi-Fi), IEEE 802.16 (WiMAX), IEEE 802.20, E-UTRA (Evolved UTRA), etc. UTRA is a part of UMTS (Universal Mobile Telecommunications System). 3GPP (3rd Generation Partnership Project) LTE (long term evolution) is a part of E-UMTS (Evolved UMTS) that uses E-UTRA. The 3GPP LTE employs OFDMA in DL and SC-FDMA in UL. And, LTE-A (LTE-Advanced) is an evolved version of 3GPP LTE.

Moreover, in the following description, specific terminologies are provided to help the understanding of the present invention. And, the use of the specific terminology can be modified into another form within the scope of the technical idea of the present invention.

Figure 1:
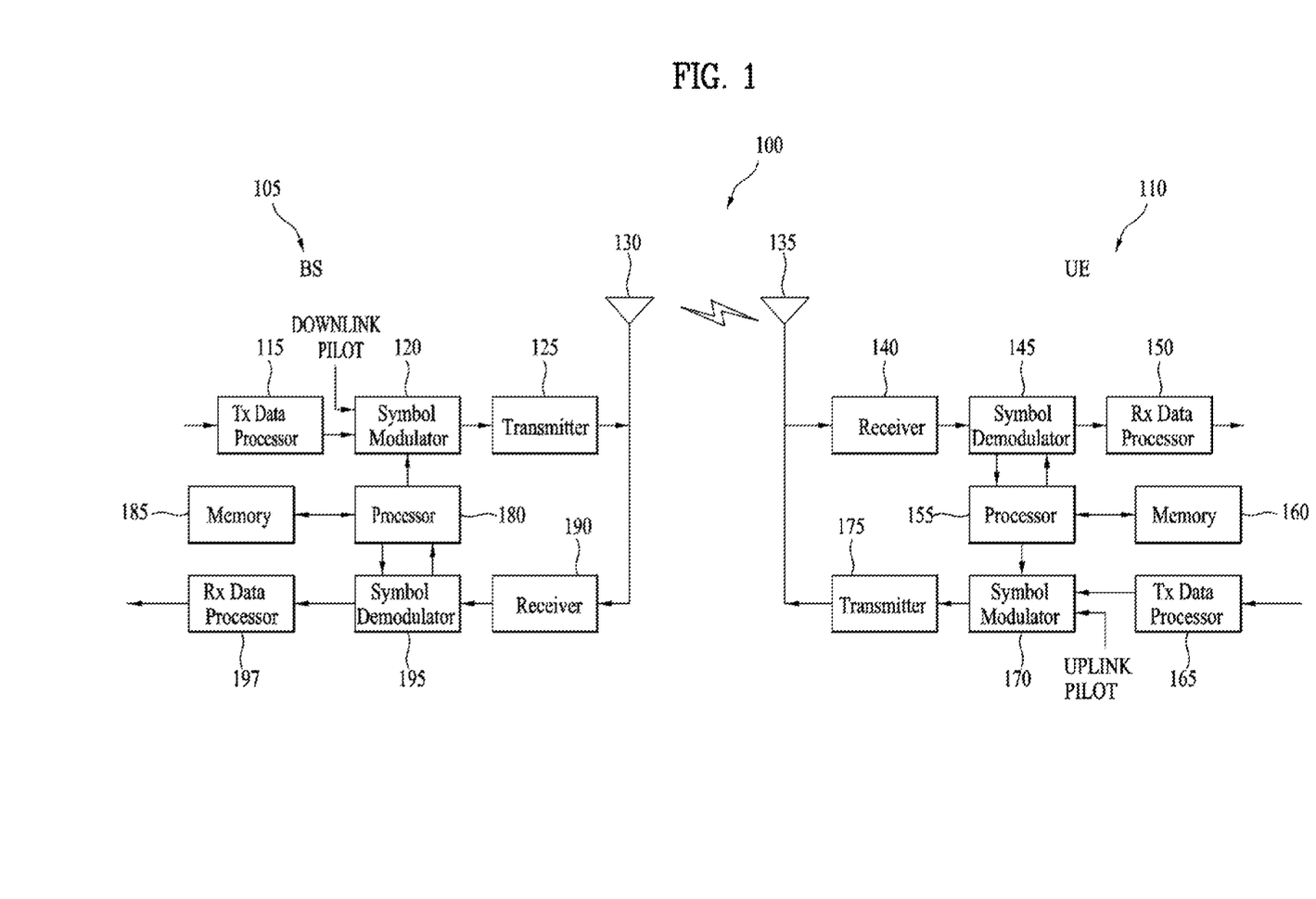
FIG. 1 is a block diagram for configurations of a base station 105 and a user equipment 110 in a wireless communication system 100.

FIG. 1 is a block diagram for configurations of a base station 105 and a user equipment 110 in a wireless communication system 100.

Although one base station 105 and one user equipment 110 (D2D user equipment included) are shown in the drawing to schematically represent a wireless communication system 100, the wireless communication system 100 may include at least one base station and/or at least one user equipment.

Referring to FIG. 1, a base station 105 may include a transmitted (Tx) data processor 115, a symbol modulator 120, a transmitter 125, a transceiving antenna 130, a processor 180, a memory 185, a receiver 190, a symbol demodulator 195 and a received data processor 197. And, a user equipment 110 may include a transmitted (Tx) data processor 165, a symbol modulator 170, a transmitter 175, a transceiving antenna 135, a processor 155, a memory 160, a receiver 140, a symbol demodulator 155 and a received data processor 150. Although the base station/user equipment 105/110 includes one antenna 130/135 in the drawing, each of the base station 105 and the user equipment 110 includes a plurality of antennas. Therefore, each of the base station 105 and the user equipment 110 of the present invention supports an MIMO (multiple input multiple output) system. And, the base station 105 according to the present invention may support both SU-MIMO (single user-MIMO) and MU-MIMO (multi user-MIMO) systems.

In downlink, the transmitted data processor 115 receives traffic data, codes the received traffic data by formatting the received traffic data, interleaves the coded traffic data, modulates (or symbol maps) the interleaved data, and then provides modulated symbols (data symbols). The symbol modulator 120 provides a stream of symbols by receiving and processing the data symbols and pilot symbols.

The symbol modulator 120 multiplexes the data and pilot symbols together and then transmits the multiplexed symbols to the transmitter 125. In doing so, each of the transmitted symbols may include the data symbol, the pilot symbol or a signal value of zero. In each symbol duration, pilot symbols may be contiguously transmitted. In doing so, the pilot symbols may include symbols of frequency division multiplexing (FDM), orthogonal frequency division multiplexing (OFDM), or code division multiplexing (CDM).

The transmitter 125 receives the stream of the symbols, converts the received stream to at least one or more analog signals, additionally adjusts the analog signals (e.g., amplification, filtering, frequency upconverting), and then generates a downlink signal suitable for a transmission on a radio channel. Subsequently, the downlink signal is transmitted to the user equipment via the antenna 130.

In the configuration of the user equipment 110, the receiving antenna 135 receives the downlink signal from the base station and then provides the received signal to the receiver 140. The receiver 140 adjusts the received signal (e.g., filtering, amplification and frequency downconverting), digitizes the adjusted signal, and then obtains samples. The symbol demodulator 145 demodulates the received pilot symbols and then provides them to the processor 155 for channel estimation.

The symbol demodulator 145 receives a frequency response estimated value for downlink from the processor 155, performs data demodulation on the received data symbols, obtains data symbol estimated values (i.e., estimated values of the transmitted data symbols), and then provides the data symbols estimated values to the received (Rx) data processor 150. The received data processor 150 reconstructs the transmitted traffic data by performing demodulation (i.e., symbol demapping, deinterleaving and decoding) on the data symbol estimated values.

The processing by the symbol demodulator 145 and the processing by the received data processor 150 are complementary to the processing by the symbol modulator 120 and the processing by the transmitted data processor 115 in the base station 105, respectively.

In the user equipment 110 in uplink, the transmitted data processor 165 processes the traffic data and then provides data symbols. The symbol modulator 170 receives the data symbols, multiplexes the received data symbols, performs modulation on the multiplexed symbols, and then provides a stream of the symbols to the transmitter 175. The transmitter 175 receives the stream of the symbols, processes the received stream, and generates an uplink signal. This uplink signal is then transmitted to the base station 105 via the antenna 135.

In the base station 105, the uplink signal is received from the user equipment 110 via the antenna 130. The receiver 190 processes the received uplink signal and then obtains samples. Subsequently, the symbol demodulator 195 processes the samples and then provides pilot symbols received in uplink and a data symbol estimated value. The received data processor 197 processes the data symbol estimated value and then reconstructs the traffic data transmitted from the user equipment 110.

The processor 155/180 of the user equipment/base station 110/105 directs operations (e.g., control, adjustment, management, etc.) of the user equipment/base station 110/105. The processor 155/180 may be connected to the memory unit 160/185 configured to store program codes and data. The memory 160/185 is connected to the processor 155/180 to store operating systems, applications and general files.

The processor 155/180 may be called one of a controller, a microcontroller, a microprocessor, a microcomputer and the like. And, the processor 155/180 may be implemented using hardware, firmware, software and/or any combinations thereof. In the implementation by hardware, the processor 155/180 may be provided with such a device configured to implement the present invention as ASICs (application specific integrated circuits), DSPs (digital signal processors), DSPDs (digital signal processing devices), PLDs (programmable logic devices), FPGAs (field programmable gate arrays), and the like.

Meanwhile, in case of implementing the embodiments of the present invention using firmware or software, the firmware or software may be configured to include modules, procedures, and/or functions for performing the above-explained functions or operations of the present invention. And, the firmware or software configured to implement the present invention is loaded in the processor 155/180 or saved in the memory 160/185 to be driven by the processor 155/180.

Layers of a radio protocol between a user equipment/base station and a wireless communication system (network) may be classified into 1st layer L1, 2nd layer L2 and 3rd layer L3 based on 3 lower layers of OSI (open system interconnection) model well known to communication systems. A physical layer belongs to the 1st layer and provides an information transfer service via a physical channel. RRC (radio resource control) layer belongs to the 3rd layer and provides control radio resourced between UE and network. A user equipment and a base station may be able to exchange RRC messages with each other through a wireless communication network and RRC layers.

In the present specification, although the processor 155/180 of the user equipment/base station performs an operation of processing signals and data except a function for the user equipment/base station 110/105 to receive or transmit a signal, for clarity, the processors 155 and 180 will not be mentioned in the following description specifically. In the following description, the processor 155/180 can be regarded as performing a series of operations such as a data processing and the like except a function of receiving or transmitting a signal without being specially mentioned.

Overall Encoding Process of Channel Coding

Figure 2:
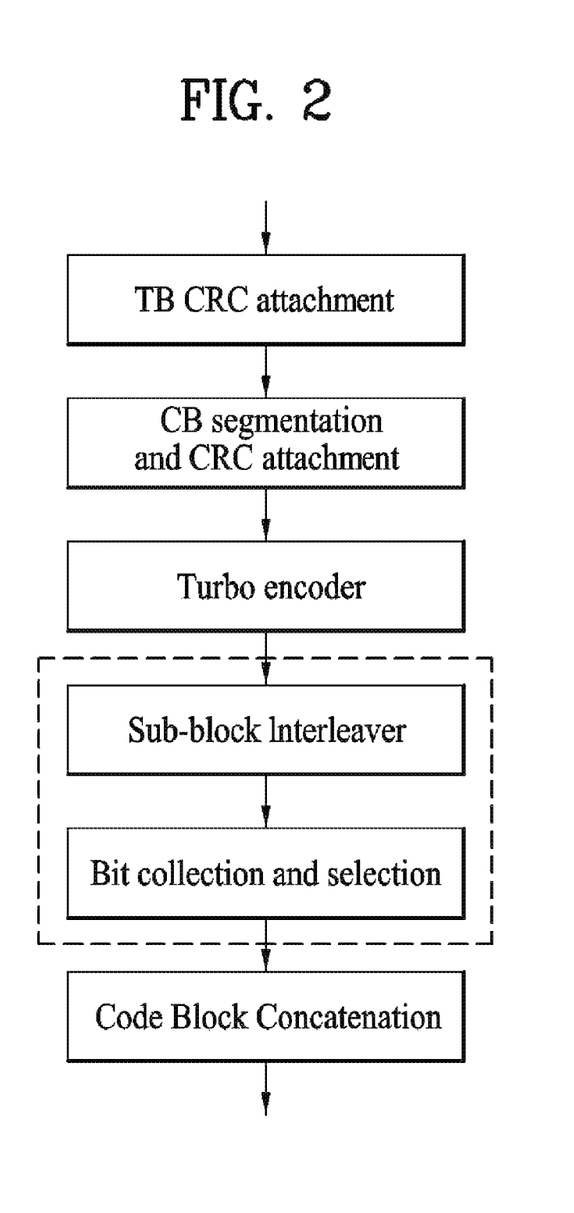
FIG. 2 is a diagram illustrating a process of performing channel coding, multiplexing, and interleaving using a turbo code.

FIG. 2 is a diagram illustrating a process of performing channel coding, multiplexing, and interleaving using a turbo code.

Referring to FIG. 2 (*a*), a channel code encoding process includes the steps of: 1) configuring a TB, 2) inserting a CRC (cyclic redundancy check) to the TB, 3) performing a CB segmentation, 4) inserting the CRC to a CB, 5) performing encoding, and 6) performing modulation.

Referring to FIG. 2, a CRC (cyclic redundancy check) code is attached to TBs (transport blocks) forwarded from a MAC layer to determine whether or not an error occurs (TB CRC attachment). Subsequently, the TBs are segmented in a unit of a CB (code block) which is defined in accordance with a turbo code attribute and turbo code encoding is performed on each block. In this case, a CRC is attached to each CB to determine whether or not an error occurs. In LTE system, since turbo code encoding is performed by ⅓ rate mother code, a turbo code output can be divided into a systematic bit, a parity 0 bit, and a parity 1 bit. In this case, sub-block interleaving is independently performed on each of the bits.

An output on which sub-block interleaving is performed is also divided into a systematic bit, parity 0 bit, and parity 1 bit. Bits of each sub-block are extracted with a predefined size according to a transmission MCS (modulation and coding scheme) and resource allocation information to generate a codeword to be transmitted. In FIG. 2, a part represented by a dotted line is also referred to as a rate matching processing unit. One or more generated codewords are outputted by combining one or more encoded CBs in a reverse process of a process of dividing a TB into one or more CBs. Subsequently, the combined CBs are inputted into a scrambler and a modulation mapper processing unit.

Figure 3:
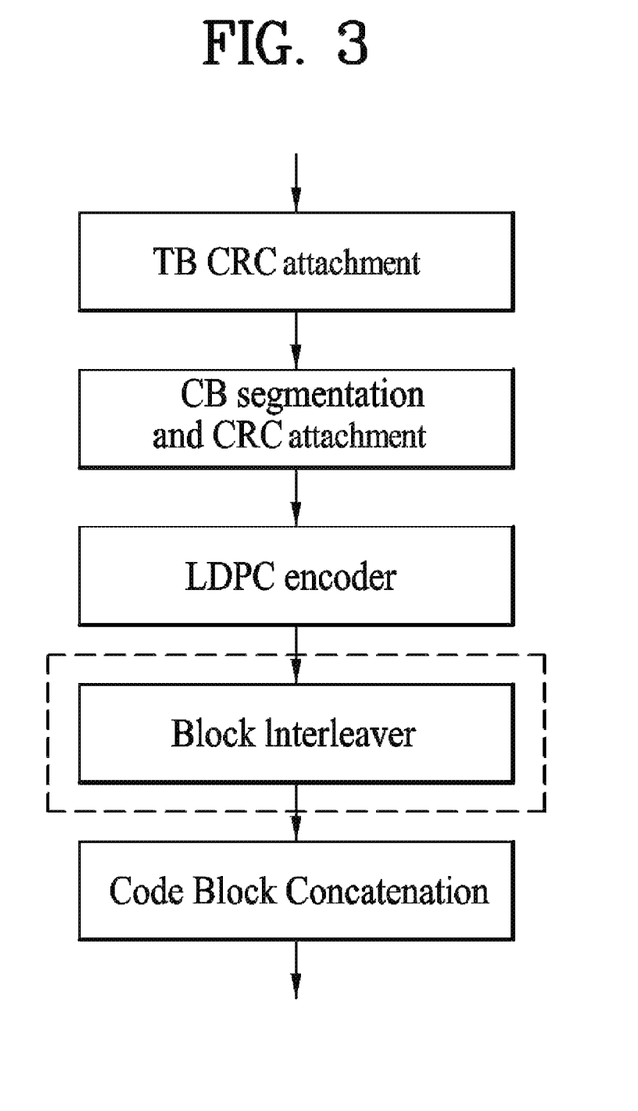
FIG. 3 is a diagram illustrating a process of performing channel coding, multiplexing, and interleaving when a LDPC (low-density parity-check code) is used as channel coding.

FIG. 3 is a diagram illustrating a process of performing channel coding, multiplexing, and interleaving when a LDPC (low-density parity-check code) is used as channel coding.

Referring to FIG. 3, a process of attaching a CRC to a TB, a process of dividing a TB into CBs, and a process of attaching a CRC to each of the CBs are similar to a turbo code. Yet, there is a difference in a rate matching processing unit which is performed after LDPC encoding. According to a legacy turbo code, sub-blocks are divided into one systematic bit sub-block and two parity bit sub-blocks due to ⅓-rate mother code. On the contrary, in case of LDPC encoder output, a codeword bit is generated according to MCS (modulation and coding scheme) and RA under one integrated block interleaving without distinction between a systematic bit sub-block and a parity bit sub-block.

A method of performing block interleaving shall be described later in detail. The one or more generated codeword bits are outputted in a manner of being integrated again.

Block Interleaving Scheme Appropriate for LDPC Encoding

1. Block Interleaving Input

Figure 4:
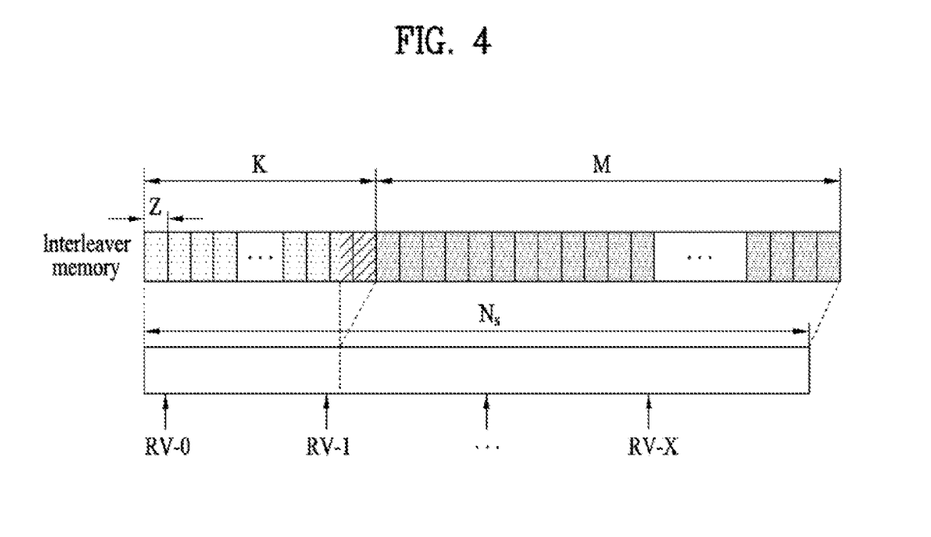
FIG. 4 is a diagram illustrating a part inputted to an interleaving memory to perform block interleaving on an output of an LDPC encoder.

FIG. 4 is a diagram illustrating a part inputted to an interleaving memory to perform block interleaving on an output of an LDPC encoder.

Since block interleaving processing summarizes an order of bits outputted after LDPC encoding in a random order, the block interleaving processing can be practically comprehended as a virtual memory operation. Yet, in order to help conceptual understanding, the block interleaving processing is explained as a separate memory input/output.

In this case, since quasi-cyclic low-density parity-check (QC-LDPC) is applied as an embodiment, encoding is performed by an LDPC parity check matrix (PCM) which is generated by lifting a random base-graph in a unit of Z. It may not be precisely matched with CB+CRC parity corresponding to an actual input of an LDPC encoder and an information size of LDPC PCM denoted by K.

As a result, such a shortening region (or section) as a part represented by a dotted line may occur. Since the part corresponds to a not transmitted part, the part is excluded form a block interleaving input. All information bits and parity bits encoded by one parity check matrix (PCM) except an information shortening region are processed by (virtual) block interleaving. And, similar to LTE, a block interleaving memory designates a random RV (redundancy version) position in advance to efficiently perform a HARQ operation.

2. Block Interleaving Scheme Appropriate for LDPC Encoding

As mentioned earlier in the region of 1. Block interleaving input, methods of outputting LDCP coding bits inputted to a (virtual) block interleaver by performing block interleaving on the LDPC coding bits are explained in the present section. According to sub-block interleaving and bit-collection selection of legacy LTE, block interleaving is performed on total codeword bits irrespective of one time transport block size. On the contrary, interleaving using an LDPC performs block interleaving according to one time transport block unit (a part of codeword bits) based on a random transmission start position (e.g., a redundancy version (RV) position). The one time transport block size is equal to or smaller than the aforementioned resource allocation size.

Hence, independent block interleaving is performed whenever retransmission is performed. Due to the characteristic of a channel coding encoding process, an output of a block interleaver is connected with a modulation mapper (QAM-mapper). Hence, it is able to directly connect an order of bits outputted from the block interleaver with an MSB to LSB order of Quadrature Amplitude Modulation (QAM). For example, 16QAM mapper generates one 16 QAM symbol via total 4 input bits from high reliability to low reliability in terms of modulation order=4 and Euclidian distance. In particular, block interleaving is performed in the aspect of a modulation order.

Figure 6:
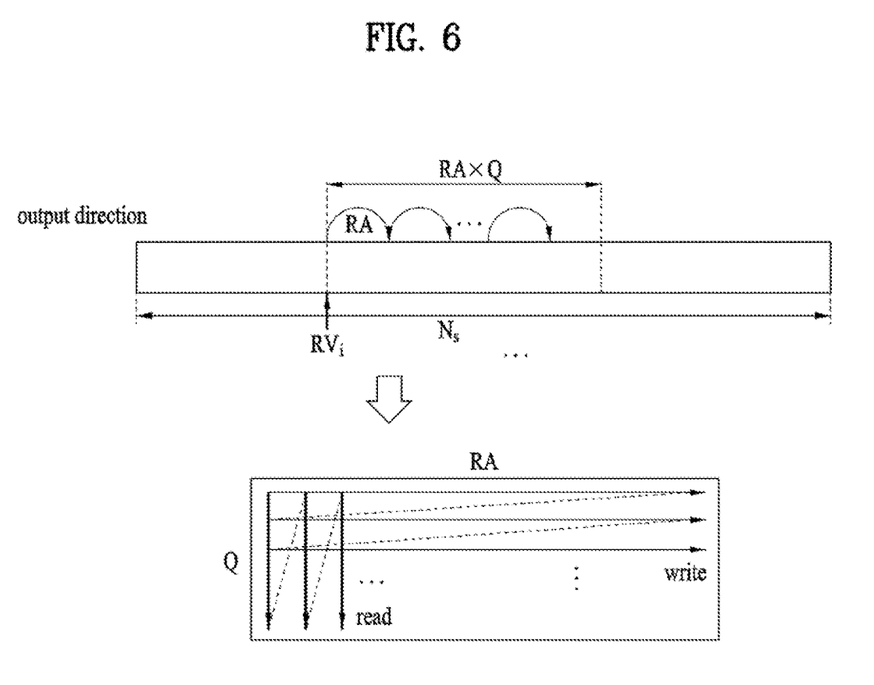
FIG. 6 is a diagram illustrating an example of a basic operation of block interleaving.

In general, if single parity extension LDPC supporting incremental redundancy is assumed, the number of connected check nodes is gradually decreased according to a parity bit extended from a former parity bit to a latter parity bit, i.e., a parity bit extended from a parity bit constructing a higher rate to a parity bit constructing a lower rate, of an encoded parity check matrix (PCM). In particular, in case of performing recovery contribution of a parity to restore information bits in limited decoding iteration, the parity bit constructing the higher rate is higher than the parity bit constructing the lower rate on average. In particular, when limited codeword bits are transmitted on the basis of an encoded codeword, if bit mapping is sequentially performed from MSBs to LSBs of QAM symbols in an order of a former information bit to a latter lower rate parity bit of the codeword bits, it may obtain a gain in the aspect of performance. The bit mapping is represented in an embodiment of FIG. 6. In this case, an interleaving rule π(n) is described in equation 1 in the following.

$$\pi(n) = \left\lfloor \frac{n}{Q} \right\rfloor + RA \times (n \bmod Q) \qquad \text{[equation 1]}$$

In this case, n corresponds to an interleaving input order index, RA corresponds to a resource allocation size of a symbol unit, Q corresponds to a QAM modulation order, and $N_s$ corresponds to a bit length of a codeword. If a currently transmitted random redundancy version position corresponds to $RV_i$, the block interleaving input order n is determined by a relative position based on the $RV_i$. A position of the n can be defined by two methods described in FIG. 5.

Figure 5:
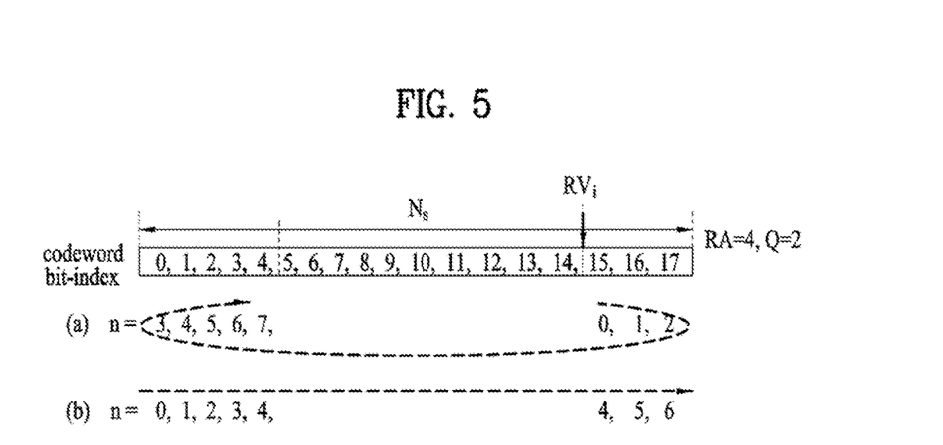
FIG. 5 is a diagram illustrating an example of performing bit-indexing performed by a block interleaver.

FIG. 5 is a diagram illustrating an example of performing bit-indexing performed by a block interleaver.

Referring to FIG. 5, when a bit length $N_s$ of a codeword corresponds to 18 and a block interleaving input index n is defined for currently transmitted 8 bits (RA×Q), as shown in FIG. 5 (a), it may perform indexing on the n in a circular direction. Or, as shown in FIG. 5 (b), it may directly perform indexing from the beginning to the end of a codeword. Referring to FIG. 5 (a), similar to LTE rate matching, an order of connecting the first bit of a codeword to the last bit of the codeword is circularly addressed as it is. Referring to FIG. 5 (b), reliability per parity bit is reflected as much as possible in a codeword.

The operation based on the equation 1 can be simply represented by FIG. 6.

FIG. 6 is a diagram illustrating an example of a basic operation of block interleaving.

As shown in FIG. 6, the operation of the equation 1 corresponds to a method of writing in a unit of an RA in row direction and reading in a unit of Q in column direction. In particular, Q number of bits of each column corresponds to Q bits which are mapped in an order of MSB (most significant bit) to LSB (least significant bit) of a modulation symbol. In the foregoing description, the number of columns performing block interleaving has been explained as Q to match the number of columns with a modulation order. Yet, the number of columns can be designated by n*Q (i.e., a multiple of Q).

As a variation of the equation 1, in order to prevent the damage of contiguous bits in an erasure channel, it may propose such a form as equation 2 described in the following. The equation 2 corresponds to a method of randomly determining an order of columns rather than a method of reading a memory in an order of continuous columns in FIG. 6.

$$\pi(n) = \varphi\left(\left\lfloor \frac{n}{Q} \right\rfloor\right) + RA \times (n \bmod Q) \quad \text{[Equation 2]}$$

In this case, n corresponds to an interleaving input order index, RA corresponds to a resource allocation size of a symbol unit, and Q corresponds to a QAM modulation order. $\psi(n)$ corresponds to a random permutation rule and is used for the purpose of distributing bits continuously mapped to two symbols. For a more decisive rule, an odd number-even number summary rule such as equation 3 is explained as an embodiment.

$$\psi(x) = \left\lfloor \frac{x}{en} \right\rfloor + 2 \times (x \bmod en), \text{ where } en = \left\lceil \frac{RA}{2} \right\rceil \quad \text{[Equation 3]}$$

If QC-LDPC has a form of a general irregular repeat accumulator (IRA) rather than a form of the previously assumed single parity extension, since a difference between recovery contributions of parity positions is irrelevant to a former and latter position relation of parity, it is preferable to prevent a bad combination from being occurred in various MCS and RA combinations by mixing LSB mapping using codeword bits and MSB of QAM. The present interleaving scheme can be represented as equation 4 in the following by modifying the equation 1.

$$\pi(n) = \left\lfloor \frac{n}{Q} \right\rfloor + RA \times \left(\left(\left\lfloor \frac{n}{Q} \right\rfloor + s + n \bmod Q\right) \bmod Q\right) \quad \text{[Equation 4]}$$

In this case, n corresponds to an interleaving input order index, RA corresponds to a resource allocation size of a symbol unit, and Q corresponds to a QAM modulation order. s corresponds to an offset variable.

Figure 7:
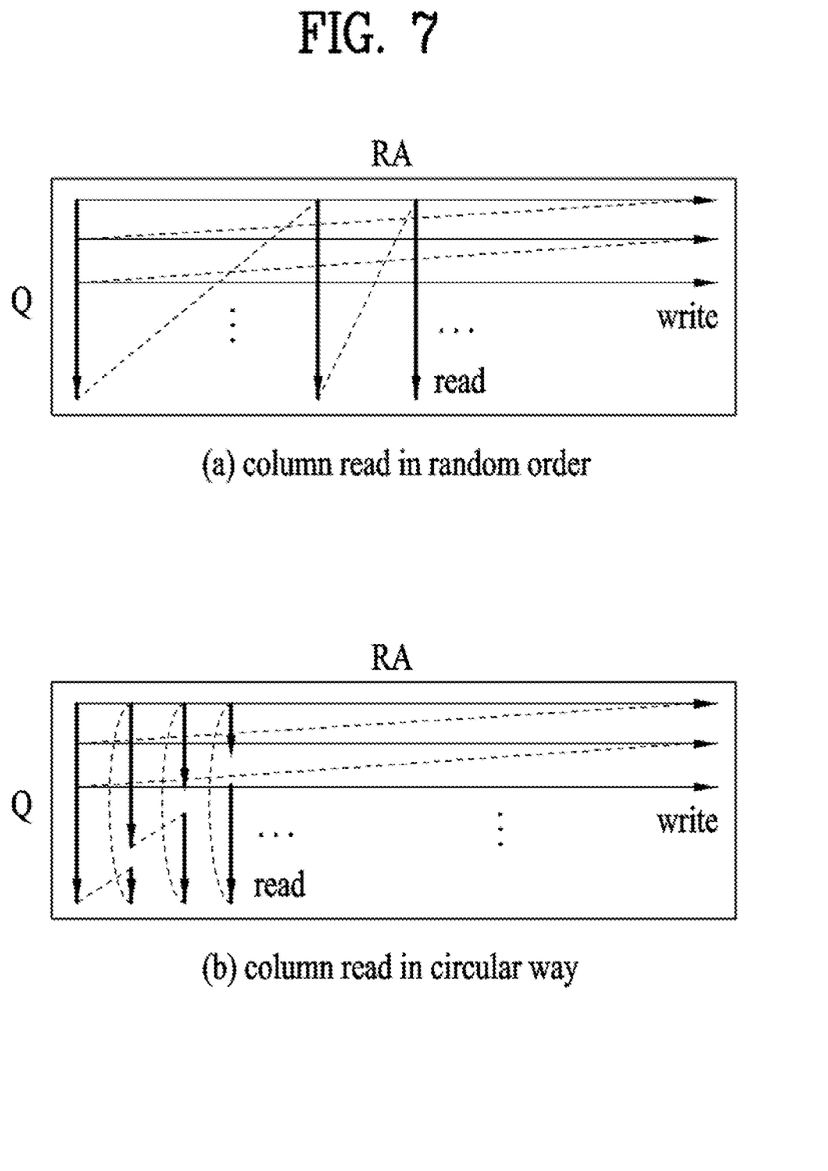
FIG. 7 is a diagram illustrating an example of a modified operation of block interleaving.

FIG. 7 is a diagram illustrating an example of a modified operation of block interleaving.

The aforementioned rules of the equation 2 and the equation 4 are schematically shown in FIG. 7 (a) and FIG. 7 (b), respectively. In particular, FIG. 7 (b) corresponds to a case assuming that an offset variable s of the equation 4 corresponds to 0. When reading every column in a unit of Q bit, an order ranging from MSB to LSB mapped to QAM is mixed again using circular shifting. The offset variable s can be configured by a different value whenever retransmission is performed.

$$\pi(n) = \psi\left(\left\lfloor \frac{n}{Q} \right\rfloor\right) + RA \times \left(\left(\left\lfloor \frac{n}{Q} \right\rfloor + s + n \bmod Q\right) \bmod Q\right) \quad \text{[Equation 5]}$$

In this case, n corresponds to an interleaving input order index, RA corresponds to a resource allocation size of a symbol unit, and Q corresponds to a QAM modulation order. s corresponds to an offset variable.

The equation 5 corresponds to an equation for indicating a case that the equation 2 and the equation 4 are used in a manner of being combined.

The above-described embodiments may correspond to combinations of elements and features of the present invention in prescribed forms. And, it may be able to consider that the respective elements or features may be selective unless they are explicitly mentioned. Each of the elements or features may be implemented in a form failing to be combined with other elements or features. Moreover, it may be able to implement an embodiment of the present invention by combining elements and/or features together in part. A sequence of operations explained for each embodiment of the present invention may be modified. Some configurations or features of one embodiment may be included in another embodiment or can be substituted for corresponding configurations or features of another embodiment. And, it is apparently understandable that a new embodiment may be configured by combining claims failing to have relation of explicit citation in the appended claims together or may be included as new claims by amendment after filing an application.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of transmitting data by a first communication apparatus based on a low-density parity-check code (LDPC), the method comprising:
   generating, by a LDPC encoder, LDPC encoded bits for the data;
   performing, by a block interleaver, block interleaving on the LDPC encoded bits to generate an interleaved data block, in a unit of a size of a transport block based on a position of redundancy version; and
   transmitting, to a second communication apparatus, the interleaved data block, wherein the block interleaving is performed independently per each of transmissions of interleaved data blocks, and wherein an offset value is used for performing the block interleaving and configured differently per each of the transmissions of the interleaved data blocks.

2. The method of claim 1,
wherein the performing the block interleaving includes mapping parity bits and information bits in the LDPC encoded bits, by a symbol modulation mapper, sequentially from a most significant bit (MSB) to a least significant bit (LSB) of a symbol.

3. The method of claim 1, wherein the performing the block interleaving comprises:
writing the LDPC encoded bits, in a row direction, in a memory of the block interleaver in a unit of a resource allocation size related to a symbol unit; and
reading the LDPC encoded bits, in a column direction, from the memory of the block interleaver in a unit of bits related to a modulation order.

4. The method of claim 2, wherein the performing the block interleaving comprises:
writing the LDPC encoded bits, in a row direction, in a memory of the block interleaver in a unit of a resource allocation size related to a symbol unit; and
reading the LDPC encoded bits, in a column direction, from the memory of the block interleaver in a unit of bits related to a modulation order.

5. The method of claim 2, wherein the symbol modulation mapper comprises a quadrature amplitude modulation (QAM) modulation mapper and the symbol comprises a QAM symbol.

6. The method of claim 3, wherein columns are read from the memory of the block interleaver in a random order.

7. The method of claim 4, wherein columns are read from the memory of the block interleaver in a random order.

8. The method of claim 2, wherein when columns mapped to the symbol are read from a memory of the block interleaver, the block interleaver reads in an order ranging from the MSB to the LSB being circularly shifted.

9. The method of claim 1, wherein the block interleaving is performed on information bits and parity bits except in an information shortening region among the LDPC encoded bits.

10. A first communication apparatus for transmitting data based on a low-density parity-check code (LDPC), the first communication apparatus comprising:
an LDPC encoder configured to generate LDPC encoded bits for the data;
a block interleaver configured to perform block interleaving on the LDPC encoded bits to generate an interleaved data block, in a unit of a size of a transport block based on a position of redundancy version; and
a transmitter configured to transmit, to a second communication apparatus, the interleaved data block,
wherein the block interleaving is performed independently per each of transmissions of interleaved data blocks, and
wherein an offset value is used for performing the block interleaving and configured differently per each of the transmissions of the interleaved data blocks.

11. The first communication apparatus of claim 10, wherein the block interleaver is configured to:
map parity bits and information bits in the LDPC encoded bits, by a symbol modulation mapper, sequentially from a most significant bit (MSB) to a least significant bit (LSB) of a symbol.

12. The first communication apparatus of claim 10, wherein the block interleaver is configured to:
write the LDPC encoded bits, in a row direction, in a memory of the block interleaver in a unit of a resource allocation size related to a symbol unit; and
read the LDPC encoded bits, in a column direction, from the memory of the block interleaver in a unit of bits related to a modulation order.

13. The first communication apparatus of claim 11, wherein the symbol modulation mapper comprises a quadrature amplitude modulation (QAM) modulation mapper and the symbol comprises a QAM symbol.

14. The first communication apparatus of claim 12, wherein the block interleaver is configured to read columns from the memory of the block interleaver in a random order.

15. The first communication apparatus of claim 11, wherein when columns mapped to the symbol are read from a memory of the block interleaver, the block interleaver is configured to read in an order ranging from the MSB to the LSB being circularly shifted.

* * * * *